(12) United States Patent
Barmettler et al.

(10) Patent No.: US 9,240,334 B2
(45) Date of Patent: Jan. 19, 2016

(54) METHOD FOR DETACHING A SEMICONDUCTOR CHIP FROM A FOIL

(71) Applicant: Besi Switzerland AG, Cham (CH)

(72) Inventors: Ernst Barmettler, Emmenbrücke (CH); Irving Rodriguez, Hermetschwil (CH)

(73) Assignee: Besi Switzerland AG, Cham (CH)

( * ) Notice: Subject to any disclaimer, the term of this patent is extended or adjusted under 35 U.S.C. 154(b) by 234 days.

(21) Appl. No.: 14/085,693

(22) Filed: Nov. 20, 2013

(65) Prior Publication Data

US 2014/0196853 A1 Jul. 17, 2014

(30) Foreign Application Priority Data

Nov. 23, 2012 (CH) .................................. 2518/12

(51) Int. Cl.
| | |
|---|---|
| *B32B 38/10* | (2006.01) |
| *H01L 21/67* | (2006.01) |
| *B32B 43/00* | (2006.01) |
| *H01L 21/683* | (2006.01) |
| *H01L 23/00* | (2006.01) |

(52) U.S. Cl.
CPC ........ *H01L 21/67011* (2013.01); *B32B 43/006* (2013.01); *H01L 21/67132* (2013.01); *H01L 21/67288* (2013.01); *H01L 21/6836* (2013.01); *H01L 24/75* (2013.01); *H01L 2221/68381* (2013.01); *H01L 2224/756* (2013.01); *H01L 2224/75753* (2013.01); *Y10S 156/932* (2013.01); *Y10S 156/943* (2013.01); *Y10T 156/1105* (2015.01); *Y10T 156/1179* (2015.01); *Y10T 156/1983* (2015.01)

(58) Field of Classification Search
CPC .............. H01L 2221/68381; Y10T 156/1132; Y10T 156/1179; Y10T 156/1944; Y10T 156/1983; Y10S 156/932; Y10S 156/943; B32B 43/006
See application file for complete search history.

(56) References Cited

U.S. PATENT DOCUMENTS

| | | | |
|---|---|---|---|
| 4,238,780 A * | 12/1980 | Doemens ............. | G01B 11/022 250/559.37 |
| 5,015,097 A | 5/1991 | Nomoto et al. | |
| 7,240,422 B2 | 7/2007 | Cheung et al. | |
| 7,824,932 B2 * | 11/2010 | Kobashi ............ | H01L 21/67132 257/E21.525 |
| 8,250,742 B2 | 8/2012 | Kloeckner et al. | |
| 2008/0057599 A1 | 3/2008 | Kobashi et al. | |

FOREIGN PATENT DOCUMENTS

| | | |
|---|---|---|
| DE | 103 47 543 | 5/2005 |
| EP | 2 211 372 | 7/2010 |

* cited by examiner

*Primary Examiner* — Mark A Osele
(74) *Attorney, Agent, or Firm* — Nixon Peabody LLP

(57) ABSTRACT

The invention relates to the prepeeling phase of methods for detaching a semiconductor chip from a foil. According to a first aspect, the invention relates to the determination of time periods, which each defines a duration of a prepeeling step. In a setup phase, the following steps are carried out for each prepeeling step:
Initiating the method step;
Repeating the two steps
  Recording of an image of the semiconductor chip and assignment of a time period to the image which has passed since the initiation of the prepeeling step, and
  Checking whether in the image a peripheral region of the semiconductor chip is darker than a predetermined brightness value;
until the check leads to the result that no peripheral region of the semiconductor chip is darker than the predetermined brightness value.
According to a second aspect, the detachment of the semiconductor chip from the foil is monitored in realtime.

6 Claims, 4 Drawing Sheets

METHOD FOR DETACHING A SEMICONDUCTOR CHIP FROM A FOIL

PRIORITY CLAIM

Applicant hereby claims foreign priority under 35 U.S.C §119 from Swiss Application No. 2518/12 filed Nov. 23, 2012, the disclosure of which is herein incorporated by reference.

FIELD OF THE INVENTION

The invention relates to a method for detaching thin semiconductor chips from a foil during the so-called prepeeling phase.

BACKGROUND OF THE INVENTION

The semiconductor chips are typically provided on a foil held by a frame, which is also known in the field as a tape, for processing on a semiconductor mounting apparatus, a so called die bonder. The semiconductor chips adhere to the foil. The frame with the foil is accommodated by a displaceable wafer table. The wafer table is displaced in order to supply one semiconductor chip after the other at a location and the supplied semiconductor chip is taken up by a chip gripper and placed on a substrate in cycles. The removal of the supplied semiconductor chip from the foil is supported by a chip ejector (known in the field as a die ejector) arranged beneath the foil.

The detachment of a semiconductor chip typically occurs in two phases, namely a first phase in which the semiconductor chip is detached at least partly from the foil by the die ejector without assistance by the chip gripper, and a second phase in which the chip gripper grips the semiconductor chip and detaches the same completely from the foil. The first phase is known by experts as "prepeeling" phase. The die ejector comprises mechanically movable means such as needles or a displaceable carriage or several plates that can be lifted and lowered, and several parameters which determine how the mechanical means are moved need to be determined and set in a setup phase. The parameters need to be set in such a way that the prepeeling process occurs within the shortest possible period of time on the one hand and the semiconductor chip is not damaged on the other hand. If the prepeeling process is performed too rapidly, there is a likelihood that the semiconductor chip will break apart.

SUMMARY OF THE INVENTION

It is the object of the present invention to improve the detachment of a semiconductor chip from the foil during the prepeeling phase.

The invention generally relates to methods for detaching a semiconductor chip from the foil during the prepeeling phase. The prepeeling phase is the phase during which the chip gripper is not involved in the detachment. In accordance with a first aspect, the invention relates to such a method comprising a setup phase for determining and setting time periods which each defines a duration of a prepeeling step of the detachment process, wherein during each prepeeling step firstly at least one area of the semiconductor chip remains sticked to the foil and is bent and afterwards detaches from the foil. The setup phase comprises the following steps:

illuminating a semiconductor chip to be removed with light which impinges substantially perpendicularly onto the surface of the semiconductor chip;

carrying out the following steps for each prepeeling step whose duration is to be determined:

initiating the prepeeling step;
  repeating the two steps:
    recording of an image of the semiconductor chip and assigning a time period to the image which has passed since the initiation of the prepeeling step, and
    checking whether in the image a peripheral region of the semiconductor chip is darker than a predetermined brightness value;
  until the check leads to the result that no peripheral region of the semiconductor chip is darker than the predetermined brightness value; and
  assigning to the prepeeling step the time period associated with the last recorded image or a time period derived therefrom.

In accordance with a second aspect, the invention relates to a method in which the detachment of the foil is monitored in realtime during the prepeeling phase. The method comprises the following steps:

illuminating a semiconductor chip to be removed with light which impinges substantially perpendicularly onto the surface of the semiconductor chip;

carrying out at least one prepeeling step, in which firstly at least one region of the semiconductor chip remains sticked to the foil and is bent and afterwards detaches from the foil, wherein each of the at least one prepeeling steps comprises the following steps:

initiating the prepeeling step;
  repeating the two steps:
    recording of an image of the semiconductor chip, and
    checking whether in the image a peripheral region of the semiconductor chip is darker than a predetermined brightness value;
  until the check leads to the result that no peripheral region of the semiconductor chip is darker than the predetermined brightness value; and
  at the end of the last prepeeling step grasping the semiconductor chip by a chip gripper and completing the detachment of the semiconductor chip from the foil.

The detachment of the semiconductor chip from the foil in the prepeeling phase occurs for example by means of a die ejector with liftable and lowerable plates. In this case, the aforementioned initiation in the prepeeling step contains the lowering of the outermost plates that have not yet been lowered.

The detachment of the semiconductor chip from the foil in the prepeeling phase can also be performed by means of a carriage that is displaceable parallel to the surface of the foil. In this case, the aforementioned initiation in the prepeeling step comprises the displacement of the carriage by a predetermined distance.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 1 schematically shows by way of example the mutual arrangement of the components of a semiconductor mounting device which are required for performing the processes in accordance with the invention;

DETAILED DESCRIPTION OF THE INVENTION

As was already mentioned in the introduction, the semiconductor chips of a wafer adhere to a foil which is clamped to a frame. The frame with the foil is accommodated by a wafer table. The next respective semiconductor chip to be taken by means of a chip gripper is made available by the wafer table at a pick point. The detachment of the supplied semiconductor chip from the foil is supported by a die ejector arranged beneath the foil. The semiconductor mounting device contains a camera whose field of view is aimed at the pick point and which is used to determine the position of the supplied semiconductor chip. This camera is used in accordance with the invention and in combination with a direct illumination of the semiconductor chip for different processes which relate to the optimization and/or the monitoring of the detachment process. These processes are:

Precise alignment of the semiconductor chip with respect to the die ejector;

Determination of the adhesive behavior of the semiconductor chip;

Determination of parameters which control the die ejector for detaching the semiconductor chip from the foil;

Monitoring of the detachment of the chip from the foil, and

Individual controlling of the detachment process from the foil for each semiconductor chip.

These processes will be explained below in detail.

Figure 1:
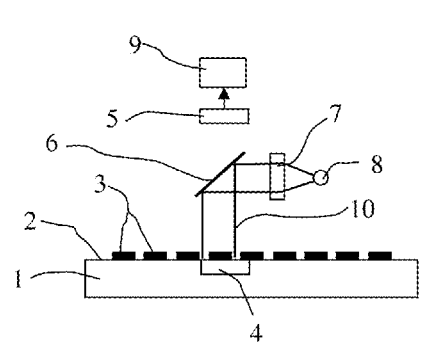

FIG. 1 schematically shows by way of example the mutual arrangement of the components of the semiconductor mounting device which are necessary for performing the processes in accordance with the invention. These components comprise a wafer table 1 which accommodates a foil 2 with the semiconductor chips 3, a die ejector 4, a camera 5, an illumination device which comprises a semitransparent mirror 6, an optical element 7 and a light source 8, and an image processing device 9. The camera 5 is typically provided as a semiconductor chip, and the optical element 7 is an aperture and/or a lens, in the focal point of which the light source 8 is arranged. The light source 8 is an LED for example. It is important for the invention that the light beams 10 of the illumination device impinge perpendicularly on the supplied semiconductor chip 3A within a predetermined tolerance value of a few degrees. The camera 5 detects the light beams which are reflected perpendicularly by the supplied semiconductor chip 3A and also by the adjacent semiconductor chips 3B, insofar as they are situated in the field of view of the camera 5, and supplies the recorded images to the image processing device 9.

Figure 2:
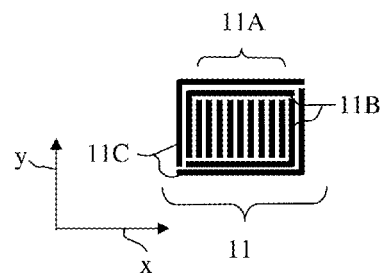
FIG. 2 shows a top view of an arrangement of liftable and lowerable plates.

The invention will be explained below by reference to a die ejector 4, as described in detail in the Swiss patent application No. 453/12 which is still unpublished on the application date of this patent application. Such a die ejector 4 comprises several plates 11, i.e. plates 11A and L-shaped plates 11B in this case, which are aligned in parallel and perpendicularly to directions designated with x and y. FIG. 2 shows such an arrangement of plates 11 in a top view, which can be lifted and lowered in a direction extending perpendicularly to the foil surface, which is designated here as the z direction. The z direction extends perpendicularly to the drawing plane of FIG. 2. The foil 2 is situated at level z=0. A drive controlled by a control device allows lifting the plates 11 together and subsequently lowering them in pairs, starting with the outermost plates, in a predetermined sequence and a predetermined progression over time.

FIGS. 3 to 13 show images of a central semiconductor chip 3A and adjacent semiconductor chips 3B as recorded by the camera 5. The semiconductor chips used for these snapshots are so-called dummy chips, i.e. structureless chips.

Figure 3:
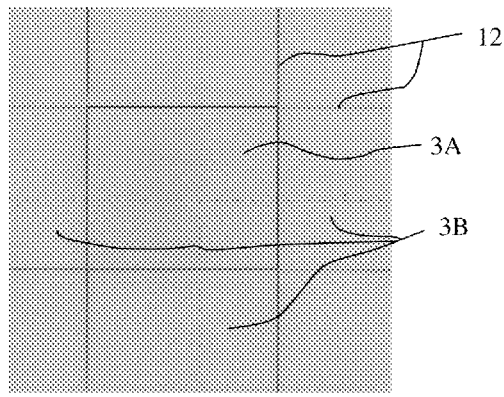
FIGS. 3-13 show images recorded by a camera.
Figure 4:
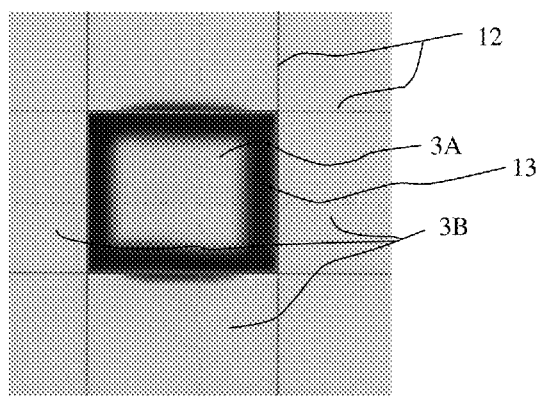

FIG. 3 shows a semiconductor chip 3A which is situated above the die ejector 4, and parts of adjacent semiconductor chips 3B. The semiconductor chip 3A and also the adjacent semiconductor chips 3B are flat, so that they reflect the light beams 10 of the illumination device which impinge perpendicularly on the chip back to the camera 5 in the perpendicular direction and appear bright in the image. The grooves 12 between the semiconductor chips 3 which were produced by sawing appear dark in the image. The dashed lines show the center of the field of view of the camera 5 in form of a crosshair. FIG. 4 shows a semiconductor chip 3A above the die ejector 4, whose peripheral regions 13 are bent downwardly. The central flat area of the semiconductor chip 3A reflects the light of the illumination device perpendicularly back to the camera 5 and appears bright in the image. The downwardly bent peripheral regions 13 of the semiconductor chip 3A reflect the light of the illumination device in an angular direction, so that the light beams reflected here do not reach the camera 5. The downwardly bent peripheral regions 13 of the semiconductor chip 3A therefore appear dark in the image or even black. The behavior of the peripheral regions 13 of the semiconductor chip 3A which is provided above the die ejector 4 is detected by means of the camera 5 and will be used as described below for optimization and/or checking the aforementioned processes. This will in the following be explained for several processes below:

1. Precise Alignment of the Semiconductor Chips with Respect to the Die Ejector

The wafer table 1 is placed and oriented (by displacement and rotation) automatically by the automatic semiconductor mounting machine or manually by an operator relative to the die ejector 4 in such a way that a semiconductor chip 3A is situated above the die ejector 4, wherein the edges of the semiconductor chip 3A are aligned as far as possible in parallel to the outer L-shaped plates 11 of the die ejector 4. In the case of ideal centering, the semiconductor chip 3A will protrude beyond the outermost plates 11 on all sides by a predetermined distance which is typically 0.3 mm. The precise alignment of the semiconductor chip 3A with respect to the die ejector 4 now occurs with the following steps:

Lifting of the plates 11 to a predetermined height $z_1 > 0$.

The height $z_1$ is advantageously dimensioned in such a way that the peripheral regions 13 of the semiconductor chip 3A are detached from the foil 2. Once the peripheral regions 13 of the semiconductor chip 3A have detached from the foil 2, the semiconductor chip 3A appears bright in the image. The peripheral regions 14 of the adjacent semiconductor chips 3B are bent upwardly with the foil 2 and therefore appear as black areas in the image.

Recording an image with the camera 5.

Figure 5:
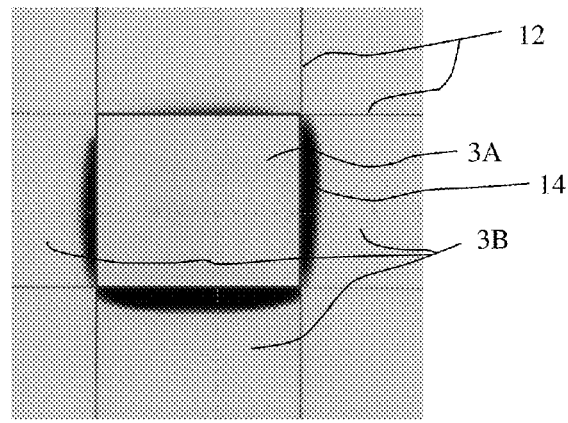

When the semiconductor chip 3A has been centered, the peripheral regions 14 of the adjacent semiconductor chips 3B which appear black in the image are all equally wide. If the semiconductor chip 3A is not centered with respect to the die ejector 4, the peripheral regions 14 of the directly adjacent semiconductor chips 3B which appear black in the image have different widths, as illustrated in FIG. 5.

Determining widths $B_1$ to $B_4$ of the four black peripheral regions.

Calculating corrective values $\Delta x=\frac{1}{2}(B_1-B_3)$ and $\Delta y=\frac{1}{2}(B_2-B_4)$, by which the wafer table 1 needs to be displaced in the x direction and y direction, or calculating corrective values $\Delta x=\frac{1}{2}(B_3-B_1)$ and $\Delta y=\frac{1}{2}(B_4-B_2)$, by which the die ejector 4 needs to be displaced in the x direction and y direction so that the semiconductor chip 3 is centered with respect to the plate 11 of the die ejector 4.

Figure 6:
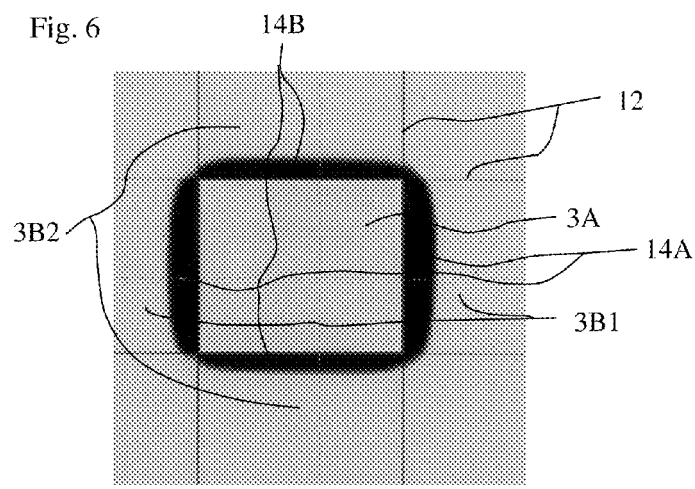

FIG. 6 shows an image of the semiconductor chip 3A and the adjacent semiconductor chips 3B, in which the peripheral regions 14A of the mutually opposite adjacent semiconductor chips 3B1 are equally wide and in which the peripheral regions 14B of the mutually opposite adjacent semiconductor chips 3B2 are equally wide. In this case, the semiconductor chip 3A is centered with respect to the die ejector 4.

The steps can be repeated for verifying and/or improving the centering.

2. Determination of the Adhesive Behavior of the Semiconductor Chips

Since the adhesiveness of the foil 2 fluctuates from foil to foil, the semiconductor chips 3 will adhere to a differently stronger extent to the foil 2 in the various wafers. The adhesive behavior of the semiconductor chips or the adhesiveness of the foil can be determined with the following steps:

1. Lifting of the plates 11 to a predetermined height $z_0$.
2. Setting $z_K=z_0$.
3. Allowing a predetermined duration $\Delta t$ to pass.
4. Recording of an image with the camera 5.
5. Verifying whether the entire surface of the semiconductor chip appears bright in the image. If there are still peripheral regions which appear dark in the image then this means that the peripheral regions are still adhering to the foil.
6. If this is the case:
    Repeating the following steps until the semiconductor chip does not contain any dark peripheral regions any more:
    6.1 Further lifting of the plates 11 by a predetermined distance $\Delta z_K$;
    6.2 Setting a new value $z_K=z_K+\Delta z_K$;
    6.3 Allowing a duration $\Delta t_v$ to pass, and
    6.4 Recording of an image with the camera 5, and
    6.5 Verifying whether the entire surface of the semiconductor chip appears bright in the image or whether it still contains dark peripheral regions.

The determined height $z_K$ is a measure for the adhesiveness.

3. Determination of Parameters which Control the Die Ejector for Detaching the Semiconductor Chips from the Foil in the Prepeeling Phase The parameters which relate to the detachment of the semiconductor chip from the foil usually need to be determined for each wafer individually or optionally for several wafers of a lot prior to the start of the mounting process and need to be set on the automatic semiconductor mounting machine. The parameters need to be determined in such a way that the detachment process occurs as rapidly as possible on the one hand and to such a slow extent on the other hand that no semiconductor chip is damaged or destroyed. In the chosen example of a die ejector 4 with liftable and lowerable plates 11, the detachment process of the semiconductor chip 3A from the foil 2 occurs in such a way that the plates 11 are lifted at first jointly to a predetermined height $z_2$ and subsequently the plates 11 are lowered, starting with the outermost plates in a predetermined sequence and a predetermined temporal progression. The point in time at which all plates 11 have been lifted to the height $z_2$ is designated with $t_0=0$. The point in time at which the two outermost plates 11 are lowered is designated with $t_1$. The point in time at which the second outermost plates 11 are lowered is designated with $t_2$. The point in time at which the third outermost plates 11 are lowered is designated with $t_3$ etc. The following parameters need to be determined:

Height $z_2$

The height $z_2$ should be as high as possible on the one hand because the foil 2 will detach more easily from the semiconductor chip 3A with increasing height. On the other hand, the height $z_2$ must only be so high that the stress in the adjacent semiconductor chips 3B will not become too high, because their peripheral regions 14 facing the semiconductor chip 3A to be detached will be bent upwardly in this process.

Durations $\Delta t_1=t_1-t_0$, $\Delta t_2=t_2-t_1$, $\Delta t_3=t_3-t_2$ etc.

Each of the durations $\Delta t_1$, $\Delta t_2$, $\Delta t_3$ etc. must be determined in such a way that the peripheral regions of the semiconductor chip 3A which protrude beyond the plates 11 that have not yet been lowered are detached completely from the foil 2 at the end of the respective duration. If such a duration is set at a length that is too short, then there is a high probability that the semiconductor chip 3A will be destroyed during the further detachment process. If the durations are set at a length which is too long, then the detachment process will take longer than necessary, which reduces the throughput of the automatic semiconductor mounting machine.

The height $z_2$ is determined with the following steps:

1. Lifting of the plates 11 to a predetermined height $z_0$.
2. Setting $z_2=z_0$.
3. Recording of an image with the camera 5 and determining the widths $B_i$ (i=1 to 4) of the black peripheral regions 14 of the directly adjacent semiconductor chips 3B. Determining a width B derived from the widths $B_1$ to $B_4$.
4. If the determined width B does not exceed a predetermined maximum width:
    Repeating the following steps until the determined width B is larger than the maximum width:
    4.1 Further lifting of the plates 11 by a predetermined distance $\Delta z$;
    4.2 Setting a new value $z_2=z_2+\Delta z$, and
    4.3 Recording of an image with the camera 5 and determining the new widths $B_1$ to $B_4$ of the black peripheral regions 14 of the directly adjacent semiconductor chips 3B;
    4.4 Determining the new width B;
    4.5 Checking whether the determined width B exceeds the maximum width.
5. Determination of the height $z_2$ to the final value $z_2=z_2-\Delta z$.

The width B derived from the widths $B_1$ to $B_4$ is for example the average of the widths $B_1$ to $B_4$ or the largest of the widths $B_1$ to $B_4$.

Figure 7:
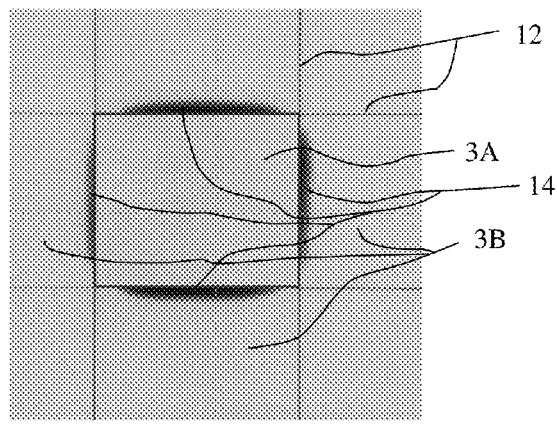
Figure 8:
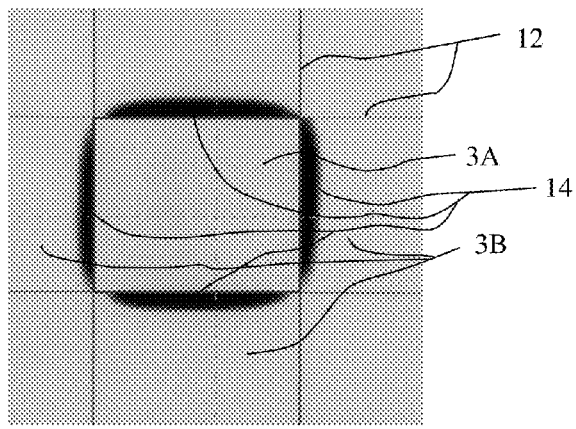
Figure 9:
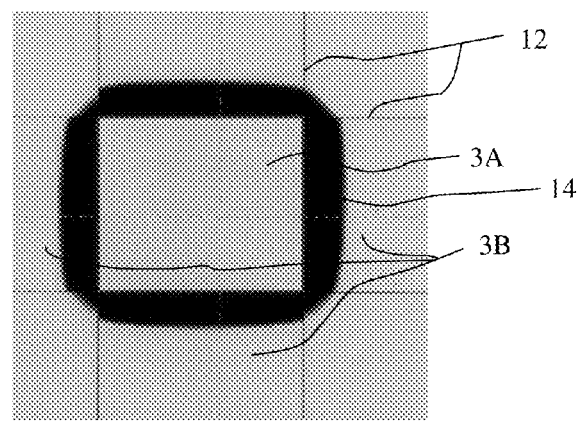

FIGS. 7 to 9 show the state of the semiconductor chip 3A and the adjacent semiconductor chips 3B as follows:

FIG. 7: after the step 3, i.e. in the state where the plates 11 have been lifted to the height $z_0$.

FIG. 8: after the first passage through the steps 4.1 to 4.5, i.e. in the state where the plate 11 have been lifted to the height $z_0+\Delta z$.

FIG. 9: after three times passage of the steps 4.1 to 4.5, i.e. in the state where the plates 11 have been lifted to the height $z_0+3*\Delta z$.

The recordings shown in FIGS. 7 to 9 were respectively made at a point in time at which the peripheral region of the semiconductor chip 3A which protrudes beyond the plates 11 of the die ejector 4 was already detached from the foil 2.

The durations $\Delta t_1$, $\Delta t_2$, $\Delta t_3$ etc. are determined in that the plates 11 are lifted to the height $z_2$ and the detachment of the semiconductor chip from the foil 2 is monitored during the step-by-step lowering of the plates 11 in order to determine the point in time at which the foil 2 has been detached completely at the peripheral regions of the semiconductor chip 3 which protrude beyond the plates 11 that have still not yet been lowered. The plates 11 are respectively lowered at least to such an extent that they no longer touch the foil 2.

This occurs by the following steps for example:
1. Lowering of the outermost plates 11.
2. Repeating the following steps:
    2.1 Recording of an image with the camera 5, and
    2.2 Evaluating the image with the image processing device 9 in the respect as to whether at least one of the peripheral regions 13 of the semiconductor chip 3A is still black or whether the entire semiconductor chip 3A appears bright;
    until the entire semiconductor chip appears bright for the first time.
3. Determining the duration from the lowering of the plates 11 in step 1 until the recording of the first image in which the entire semiconductor chip 3A appeared bright.

The step 2 can also be performed in such a way that the camera 5 records one image after the other in a predetermined temporal progression and the images are subsequently evaluated.

Figure 10:
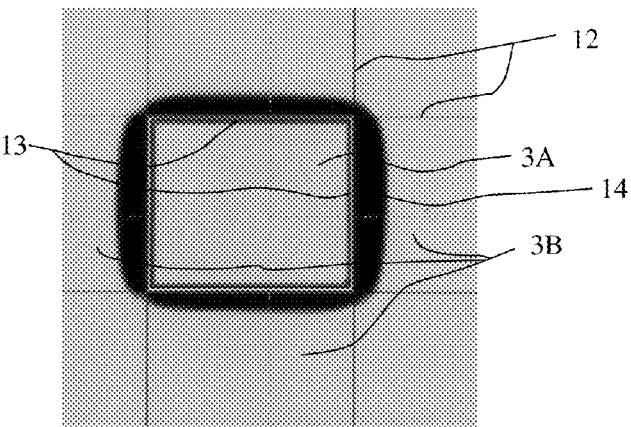
Figure 11:
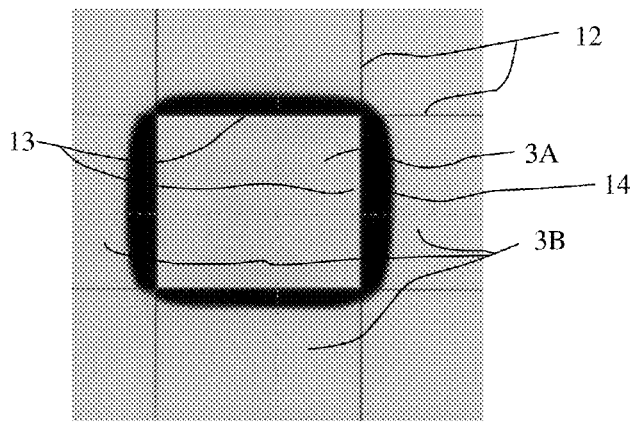
Figure 12:
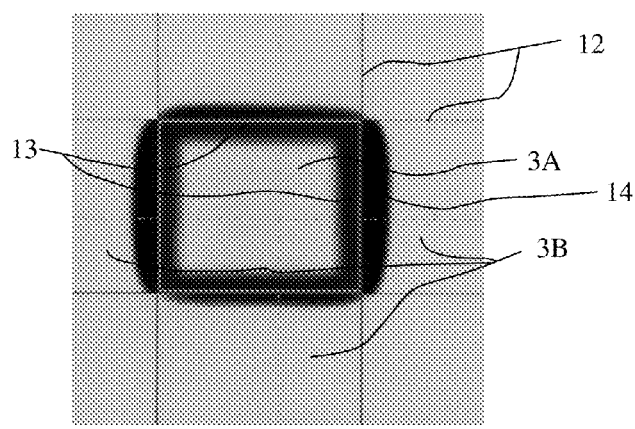
Figure 13:
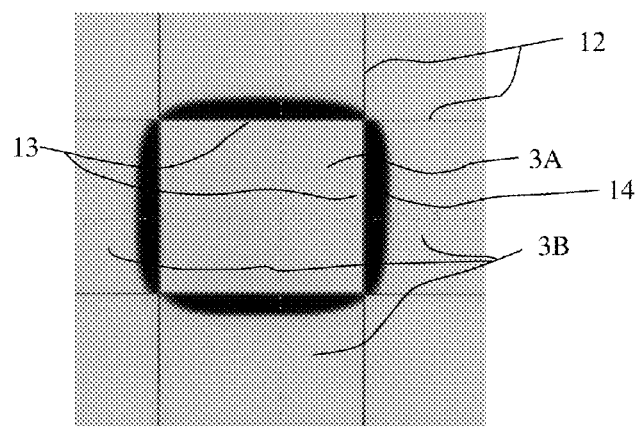

FIGS. 10 to 13 show the state of the semiconductor chip 3A and the adjacent semiconductor chips 3B as follows:
FIG. 10: at the point in time $t_0$, i.e. directly after the lifting of the plates 11 where the peripheral regions 13 of the semiconductor chip 3A which protrude beyond the plates 11 have not yet detached from the foil 2.
FIG. 11: at the point in time $t_1$, where the peripheral regions 13 of the semiconductor chip 3A which protrude beyond the plates 11 have detached from the foil 2 and therefore also appear bright.
FIG. 12: shortly after the point in time $t_1$, after the two outermost plates 11 have been lowered and before the peripheral regions 13 of the semiconductor chip 3A which protrude beyond the plates 11 remaining at the height $z_2$ have detached from the foil 2.
FIG. 13: at the point in time $t_2$, where the peripheral regions 13 of the semiconductor chip 3A which protrude beyond the plates 11 remaining at the height $z_2$ have detached from the foil 2.
The state shortly after the point in time $t_2$, after which the two second outermost plates 11 have been lowered and before the peripheral regions 13 of the semiconductor chip 3A which protrude beyond the plates 11 remaining at height $z_2$ have detached from the foil 2, corresponds to the state shown in FIG. 4. The state at the point in time $t_3$ corresponds to the state again shown in FIG. 13.

The areas of a wafer in which the semiconductor chips 3 will adhere more strongly to the foil 2 are usually known. The durations $\Delta t_1$, $\Delta t_2$, $\Delta t_3$ etc. are therefore advantageously determined at several locations of the wafer and the longest thereof will then be chosen as the final durations and stored as the process parameter. Alternatively, durations derived from the determined durations $\Delta t_1$, $\Delta t_2$, $\Delta t_3$ etc. can be stored as process parameters. A derived duration is a duration that has been extended for example by a predetermined safety duration $\Delta t$. Subsequently, the wafer will then be processed with the parameters for the detachment process which were determined in this manner.

4. Monitoring of the Detachment of the Semiconductor Chip from the Foil in the Prepeeling Phase
As long as the detachment of the semiconductor chip from the foil occurs as a prepeeling without any help of the chip gripper, and the chip gripper is not yet in the field of view of the camera 5, the camera 5 can be used for monitoring the detachment process, e.g. by the following steps:
1. Recording of an image with the camera 5 after the expiration of the respective duration $\Delta t_1$ or $\Delta t_2$ or $\Delta t_3$ etc.
2. Evaluating the image with the image processing device 9 as to whether the entire semiconductor chip appears bright in the image.
    If this is the case: continuing the detachment process.
    If this is not the case: terminating the current detachment process and issuing of an alarm.

5. Individual Controlling of the Detachment Process from the Foil for Each Semiconductor Chip in the Prepeeling Phase
The methods 3 and 4 can be combined and slightly modified in order to control the detachment process from the foil during the prepeeling phase for each semiconductor chip individually. This is provided by the method with the following steps for example:
1. Determining the height $z_2$ as described in method 3, either individually for a new wafer or for an entire lot of wafers.
2. Processing of the semiconductor chips of a wafer with the following steps:
    2.1 Lifting of the plates 11 to the height $z_2$.
    2.2 carrying out at least one prepeeling step comprising
        2.2.1 Lowering of the outermost plates 11.
        2.2.2 Optionally, waiting for a predetermined duration.
        2.2.3 Recording of an image with the camera 5.
        2.2.4 Evaluating the image with the image processing device 9 in the respect whether the entire semiconductor chip appears bright in the image.
            If this is not the case: repetition of the steps 2.2.2 to 2.2.4.
            If this is the case: continuing with the next prepeeling step with lowering of the next outermost plates, i.e. the step 2.2.1 for the next outermost plates that have not yet been lowered, or continuing with grasping the semiconductor chip by the chip gripper and completing the detachment of the semiconductor chip from the foil.

In this process, the next plates 11 will always be lowered whenever the foil 2 has detached completely from the semiconductor chip 3A in the peripheral regions of the semiconductor chip 3A which protrude beyond the plates 11 that have not yet been lowered. This occurs until the last plates have been lowered or until the chip gripper is able to grip the semiconductor chip and supports the final part of the detachment process.

The invention is not limited to the aforementioned die ejector 4, but can be applied to each process in which the foil 2 is detached step-by-step or continuously from the semiconductor chip. In particular, the method in accordance with the invention can also be used in other die ejectors with lowerable plates such as the die ejector described in the U.S. Pat. No. 8,250,742 for example or in die ejectors with a displaceable carriage such as the die ejector described in the European patent application EP 2211372. In this case, the step-by-step lowering of the plates corresponds to a step-by-step displacement of the carriage.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. Method for detaching semiconductor chips from a foil, the method comprising a setup phase for determining and setting time periods which each defines a duration of a prepeeling step of the detachment process, wherein during each prepeeling step firstly at least one area of the semiconductor chip remains sticked to the foil and is bent and afterwards detaches from the foil, the setup phase comprising the following steps:
  illuminating a semiconductor chip to be removed with light which impinges substantially perpendicularly onto the surface of the semiconductor chip;
  carrying out the following steps for each prepeeling step whose duration is to be determined:
    initiating the prepeeling step;
    repeating the two steps:
      recording of an image of the semiconductor chip and assigning a time period to the image which has passed since the initiation of the prepeeling step, and
      checking whether in the image a peripheral region of the semiconductor chip is darker than a predetermined brightness value;
    until the check leads to the result that no peripheral region of the semiconductor chip is darker than the predetermined brightness value; and
    assigning to the prepeeling step the time period associated with the last recorded image or a time period derived therefrom.

2. Method according to claim 1, the method further comprising using a die ejector with liftable and lowerable plates for the detachment of the semiconductor chips from the foil, wherein the aforementioned initiation in the at least one prepeeling step contains the lowering of the outermost plates which have not yet been lowered.

3. Method according to claim 1, the method further comprising using a die ejector with a carriage, which is displaceable parallel to the surface of the foil, for the detachment of the semiconductor chips from the foil, wherein the aforementioned initiation in the at least one prepeeling step comprises the displacement of the carriage by a predetermined distance.

4. Method for detaching semiconductor chips from a foil, the method comprising the following steps:
  illuminating a semiconductor chip to be removed with light which impinges substantially perpendicularly onto the surface of the semiconductor chip;
  carrying out at least one prepeeling step, in which firstly at least one region of the semiconductor chip remains sticked to the foil and is bent and afterwards detaches from the foil, wherein each of the at least one prepeeling steps comprises the following steps:
    initiating the prepeeling step;
    repeating the two steps:
      recording of an image of the semiconductor chip, and
      checking whether in the image a peripheral region of the semiconductor chip is darker than a predetermined brightness value;
    until the check leads to the result that no peripheral region of the semiconductor chip is darker than the predetermined brightness value; and
    at the end of the last prepeeling step grasping the semiconductor chip by a chip gripper and completing the detachment of the semiconductor chip from the foil.

5. Method according to claim 4, the method further comprising using a die ejector with liftable and lowerable plates for the detachment of the semiconductor chips from the foil, wherein the aforementioned initiation in the at least one prepeeling step contains the lowering of the outermost plates which have not yet been lowered.

6. Method according to claim 4, the method further comprising using a die ejector with a carriage, which is displaceable parallel to the surface of the foil, for the detachment of the semiconductor chips from the foil, wherein the aforementioned initiation in the at least one prepeeling step comprises the displacement of the carriage by a predetermined distance.

* * * * *